(12) United States Patent
Tervo et al.

(10) Patent No.: US 6,856,153 B2
(45) Date of Patent: *Feb. 15, 2005

(54) LOW-CURRENT POGO PROBE CARD

(75) Inventors: Paul A. Tervo, Vancouer, WA (US); Clarence E. Cowan, Newberg, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/616,164

(22) Filed: Jul. 7, 2003

(65) Prior Publication Data

US 2004/0027145 A1 Feb. 12, 2004

Related U.S. Application Data

(63) Continuation of application No. 10/313,746, filed on Dec. 6, 2002, now Pat. No. 6,822,467, which is a continuation of application No. 09/490,264, filed on Jan. 24, 2000, now Pat. No. 6,559,668, which is a continuation of application No. 08/871,609, filed on Jun. 10, 1997, now Pat. No. 6,034,533.

(51) Int. Cl.[7] .............................................. G01R 31/02
(52) U.S. Cl. ...................................... 324/754; 324/762
(58) Field of Search ............................ 324/158.1, 73.1, 324/754, 761; 438/66–70, 482; 333/246–248, 84

(56) References Cited

U.S. PATENT DOCUMENTS

| | | | | |
|---|---|---|---|---|
| 3,810,017 A | * | 5/1974 | Wiesler et al. ............... | 324/762 |
| 4,899,106 A | * | 2/1990 | Ogura ......................... | 324/754 |
| 4,973,903 A | * | 11/1990 | Schemmel ................... | 324/754 |
| 4,983,907 A | * | 1/1991 | Crowley ...................... | 324/754 |
| 6,034,533 A | * | 3/2000 | Tervo et al. ................. | 324/762 |

\* cited by examiner

*Primary Examiner*—Vinh P. Nguyen
(74) *Attorney, Agent, or Firm*—Chernoff Vilhauer McClung & Stenzel, LLP

(57) ABSTRACT

A low-current pogo probe card for measuring currents down to the femtoamp region includes a laminate board having a layer of conductive traces interposed between two dielectric layers. A plurality of probing devices, such as ceramic blades, are edge-mounted about a central opening so that the probing needles or needles included therein terminate below the opening in a pattern suitable for probing a test subject workpiece. A plurality of pogo pin receiving pad sets, each including a guard pad, occupy the periphery of the board. Each guard pad is electrically connected to a trace from the layer of conductive traces. The pad sets may be connected to the probing devices by low noise cables or traces. Air trenches separate the pad sets for reducing cross talk and signal settling times.

14 Claims, 13 Drawing Sheets

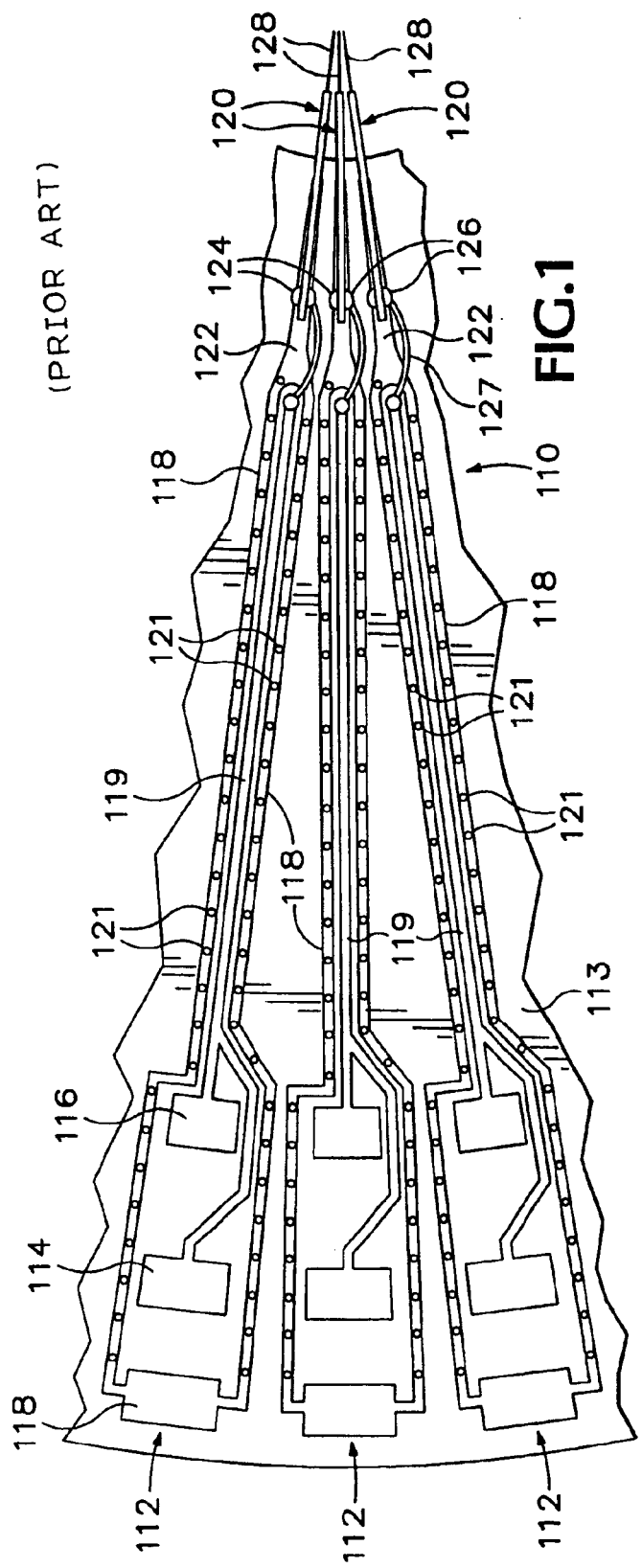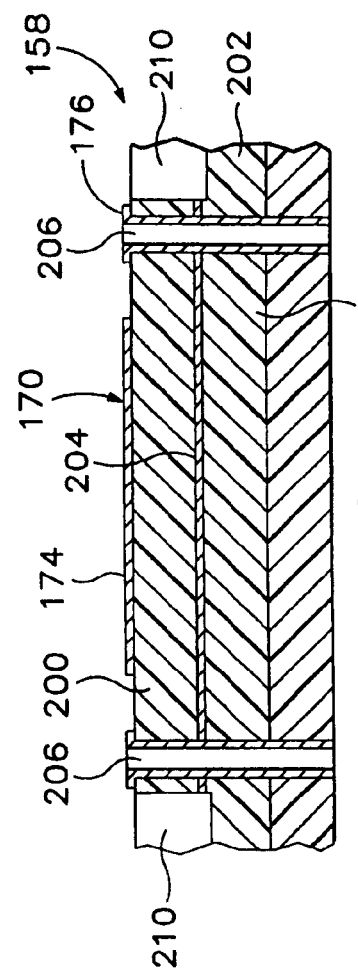
FIG. 1 (PRIOR ART)
FIG. 2B

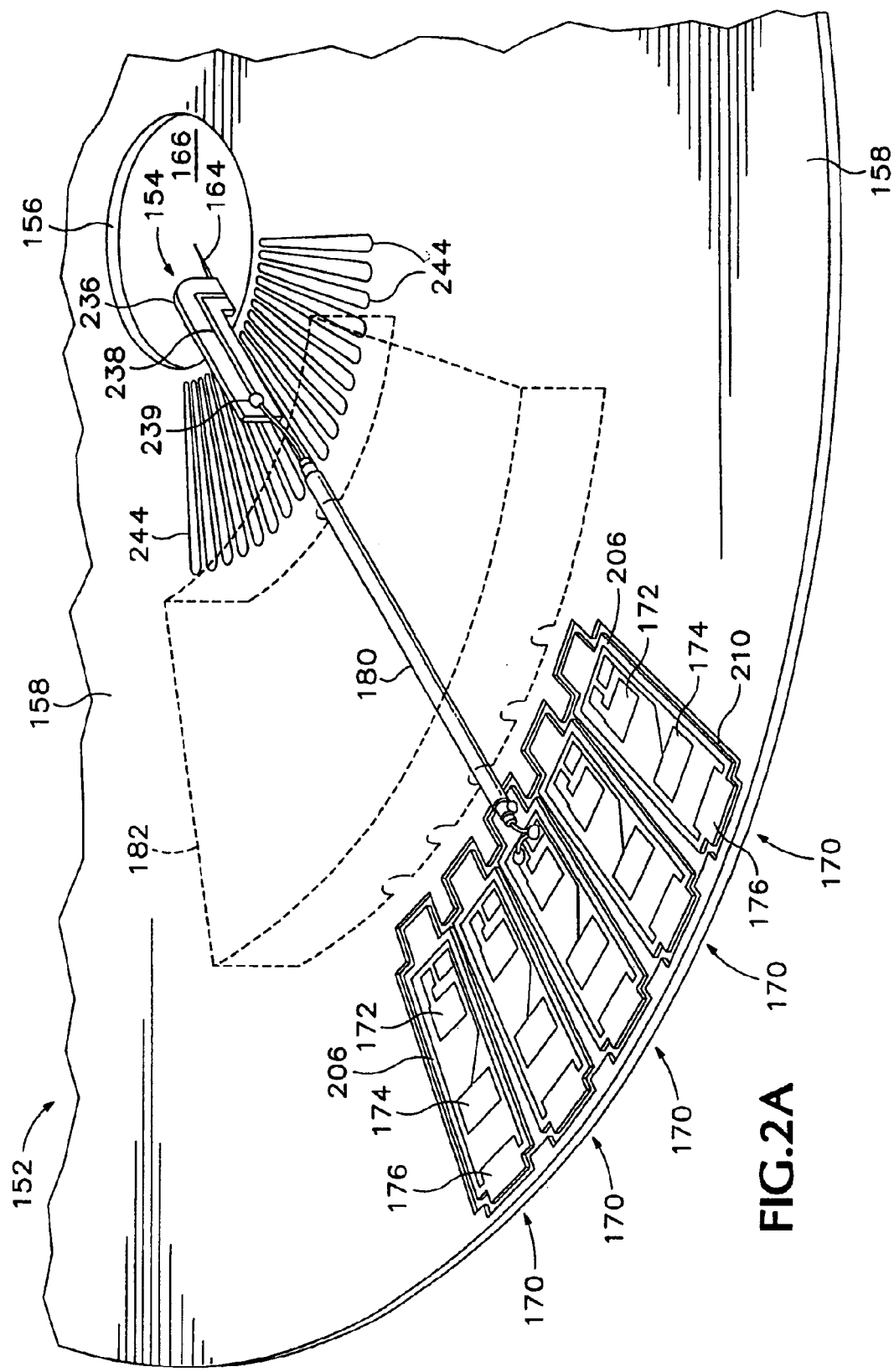

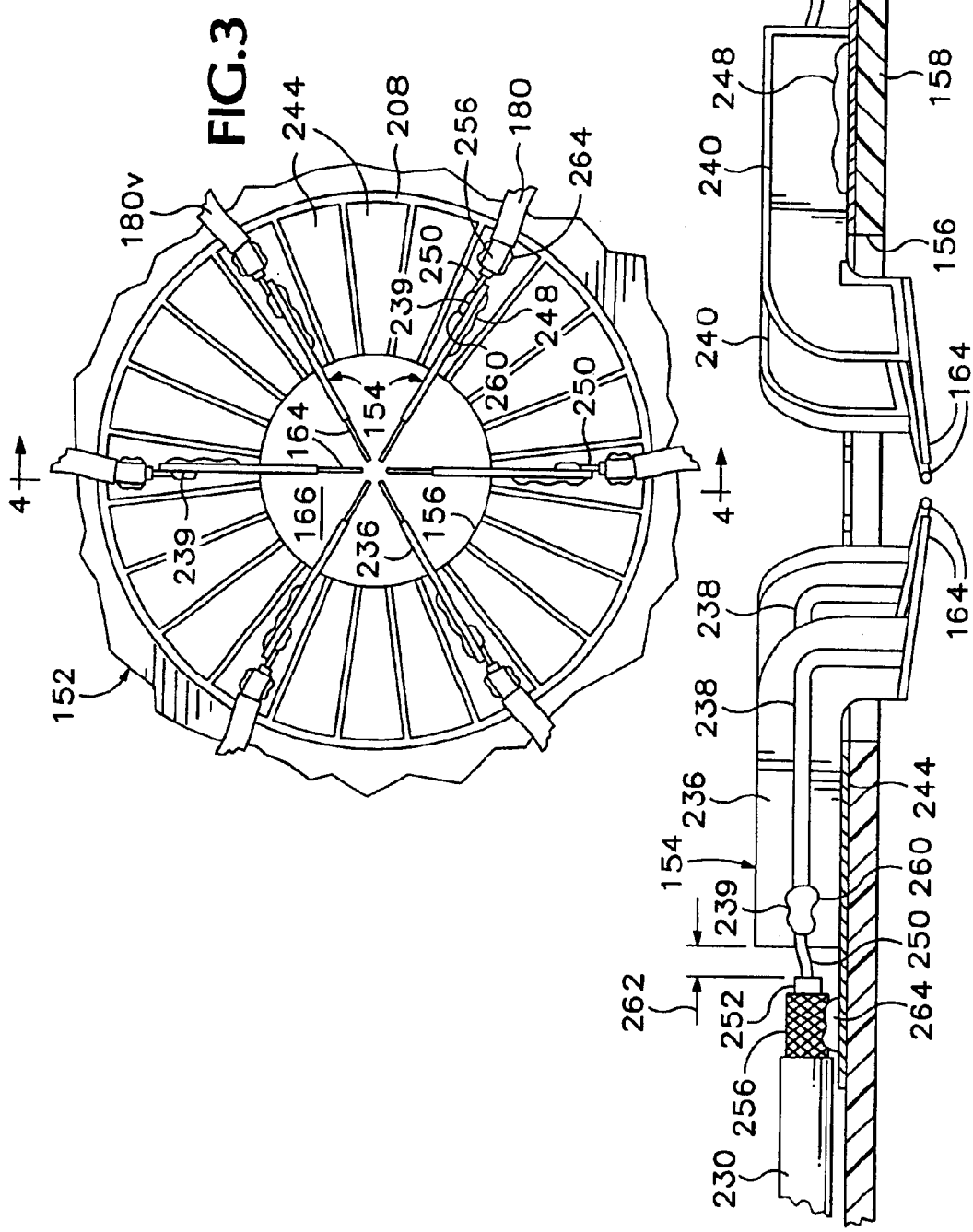

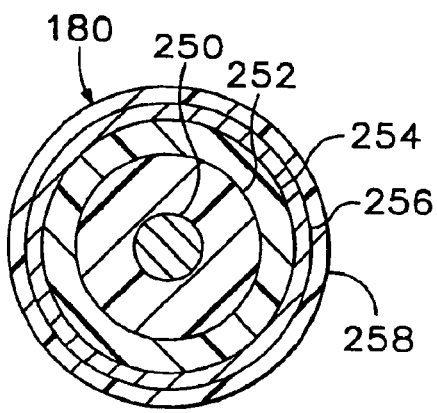
FIG.5
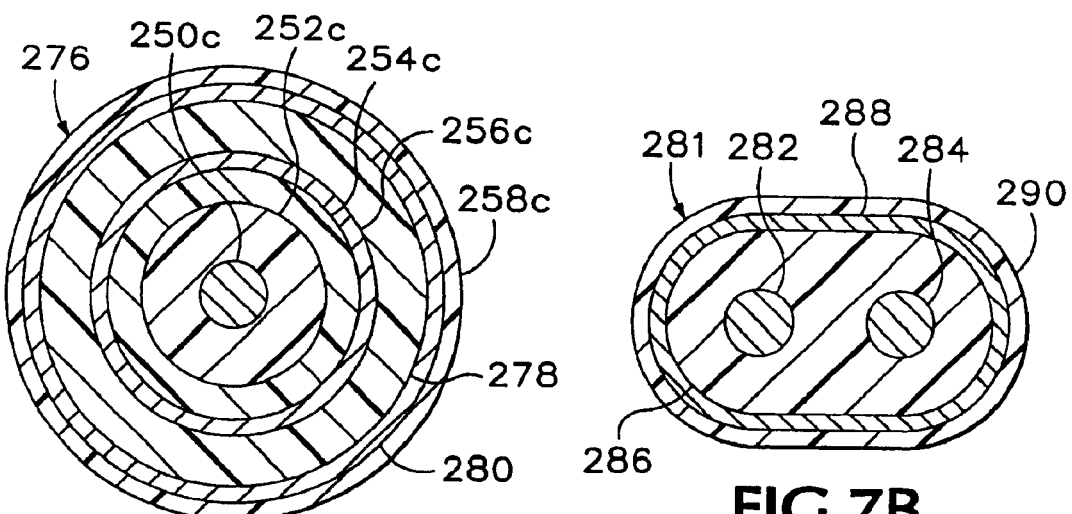
FIG.7A
FIG.7B

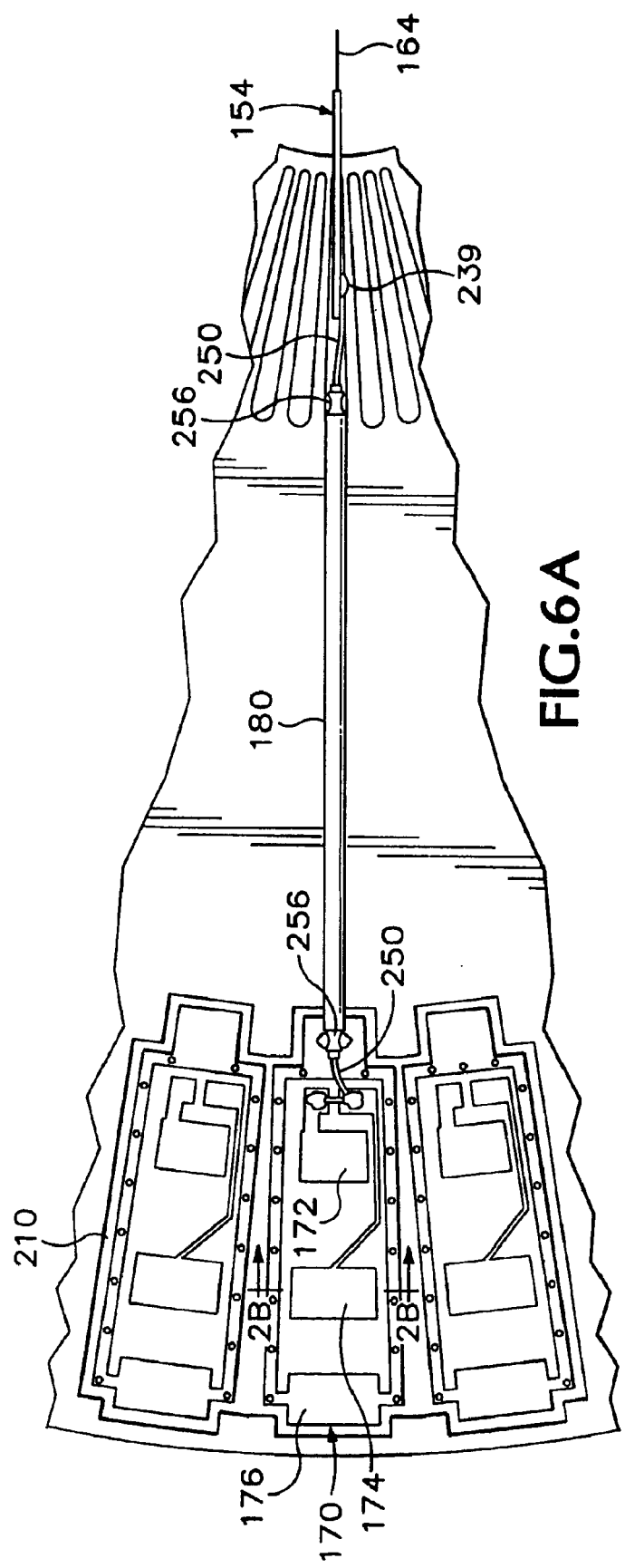

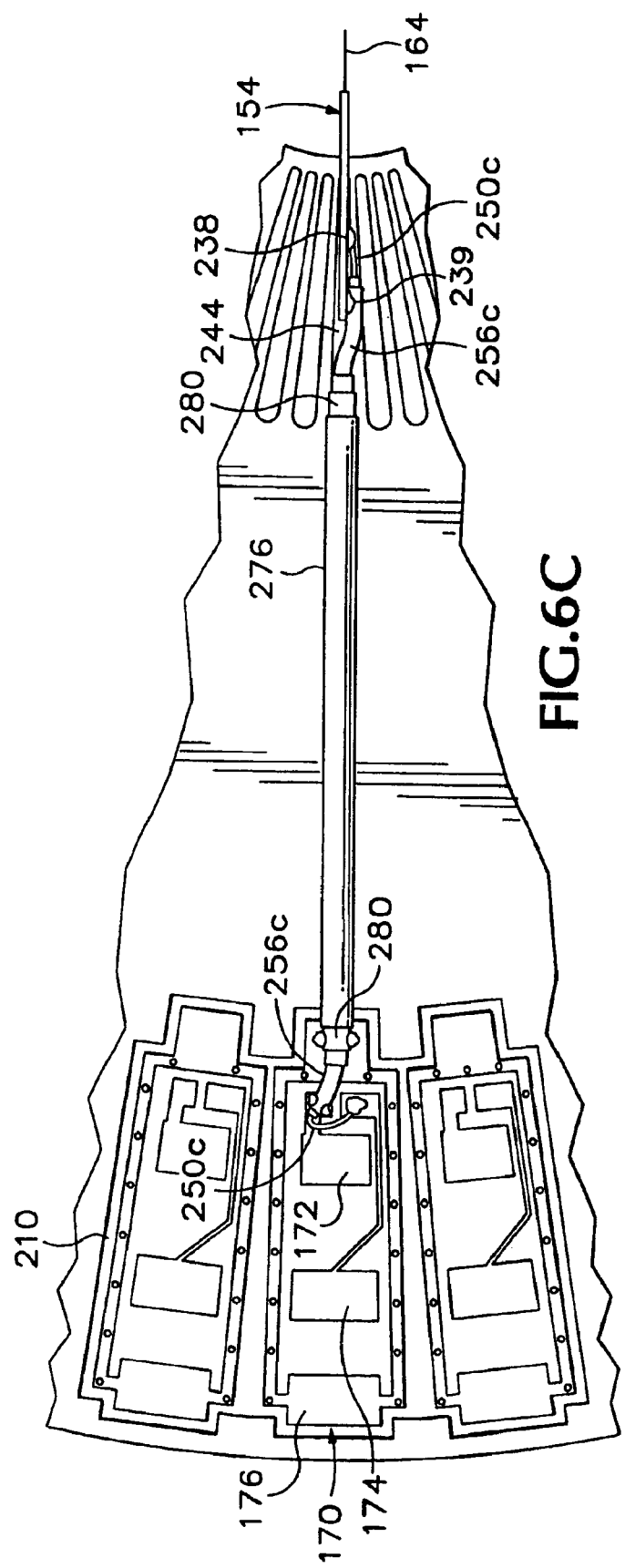

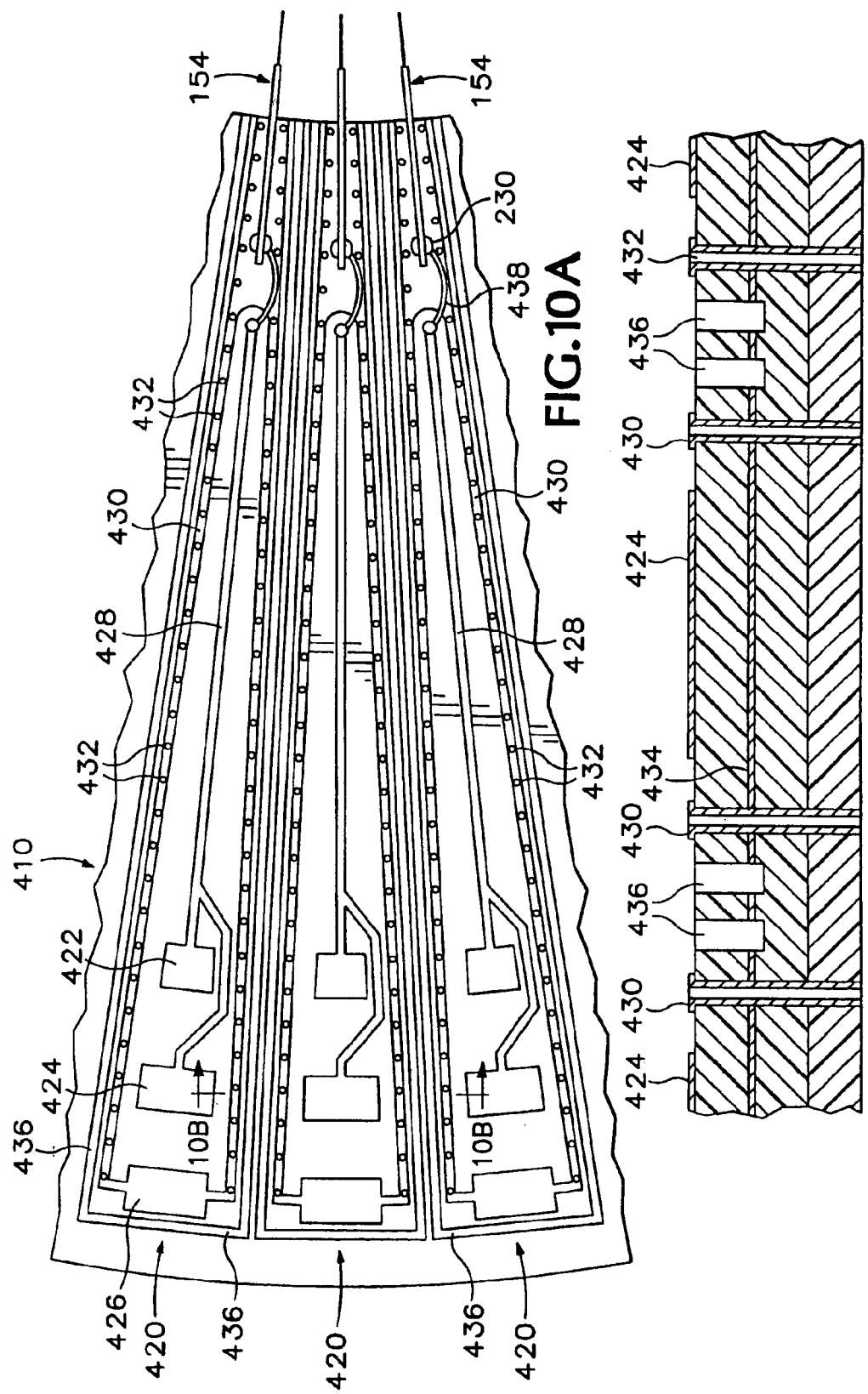

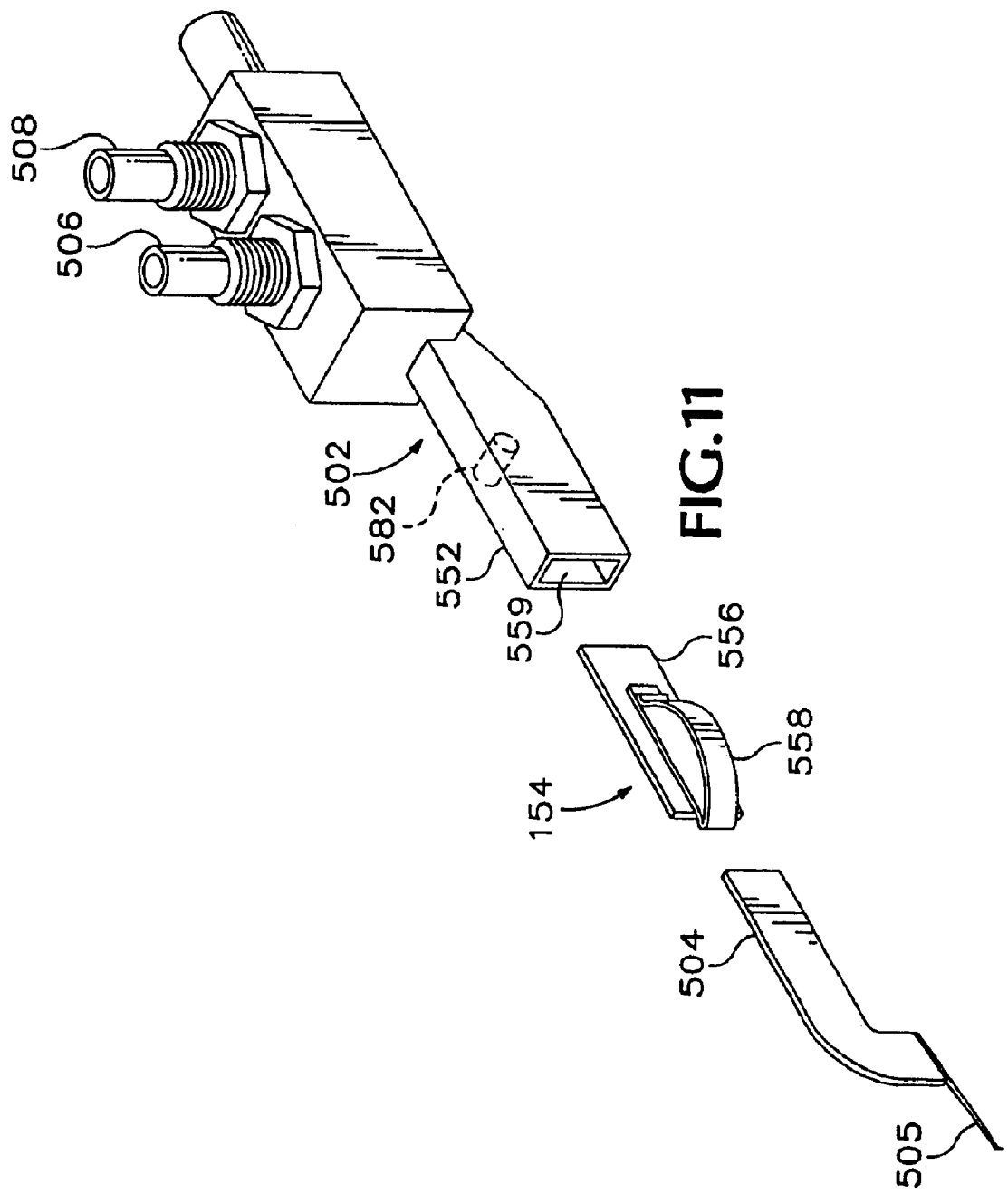

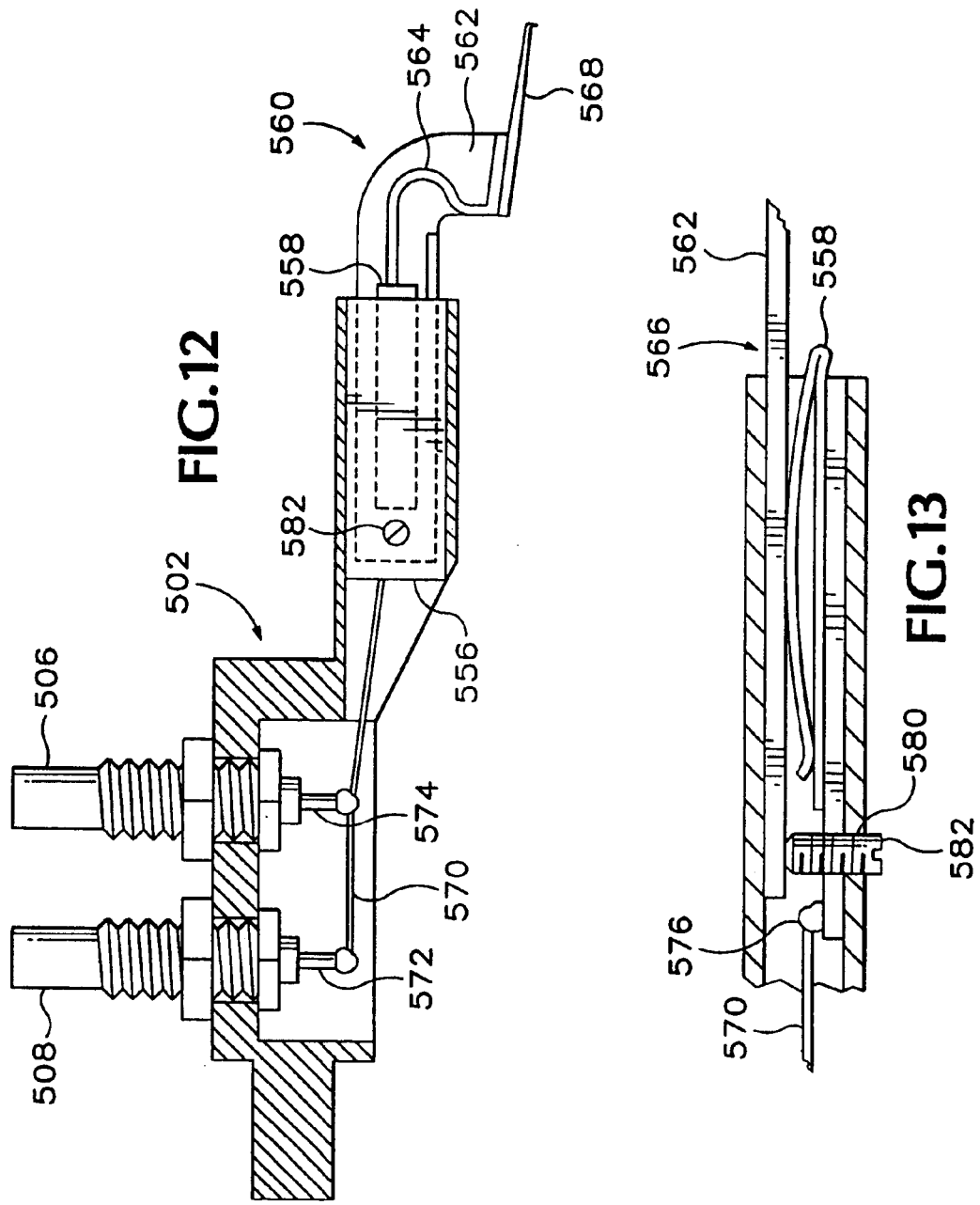

LOW-CURRENT POGO PROBE CARD

This application is a continuation of U.S. patent application Ser. No. 10/313,746 filed on Dec. 6, 2002, now U.S. Pat. No. 6,822,467; which is a continuation of application Ser. No. 09/490,264, filed Jan. 24, 2000, now U.S. Pat. No. 6,559,668; which is a continuation of application Ser. No. 08/871,609, filed Jan. 10, 1997, now U.S. Pat. No. 6,034,533.

BACKGROUND OF THE INVENTION

The present invention relates to pogo probe cards used for probing test subject workpieces, such as wafers of integrated circuit dies ("IC wafer dies"), and in particular relates to pogo probe cards suitable for use in measuring current as low as the femtoamp order of magnitude (ultra-low current).

Typically, a pogo probe card includes a dielectric board having top and bottom major surfaces and forming a base for other elements. A plurality of probing devices are mounted in radial arrangement about the top rim of a round central opening in the board. A probing needle for each of these devices terminates below the opening in a pattern suitable for probing contact sites, otherwise referred to as test sites, of an IC wafer die. For ease of description in this application the portion of the pogo probe card which in operation is closest to the IC wafer is denoted as the bottom of the card, although other geometries of test are possible.

Around the exterior periphery of the pogo probe card there are typically 48, 64 or 96 pogo pin receptive pads or pad sets, each of which is electrically connected to a respective one of the probing devices by a signal trace or set of traces. During testing, a mating pogo test head with a matching set of 48, 64 or 96 pogo pins or pin sets, touches the pogo probe card so that the pogo pins make electrical contact with the receptive pads. In this manner the probing devices are individually connected to respective channels of a test instrument by the pogo pin sets and further cabling.

In one conventional type of setup for testing IC wafer dies, the pogo probe card is mounted by a supporting rig above the IC wafer, and a chuck supports and moves the IC wafer so that each die, or region to be tested, is consecutively brought into contact with the probing needles.

As integrated circuitry has been made smaller, a need has developed for test devices which can measure ultra-low current. The typical use for this type of device is to measure IC leakage currents. These are currents that flow away from the intended current path within the IC, typically due to design flaws or fabrication artifacts.

Low-current measurements are typically performed with two conductive paths ("force" and "sense") either reaching the test site independently ("true Kelvin" connection) or joining together in the proximity of the test site ("quasi Kelvin" connection) to form a "signal path." The force path, whose test equipment terminus has a relatively low impedance, is provided with a particular current. The sense path, whose test equipment terminus has a very high impedance, measures the voltage at the test site. As such, the current versus voltage characteristics of the test device can be obtained using the force and sense paths.

This test configuration is desirable because although small variations in current are being measured, the amount of current directed to the test site might be large enough so that there is a significant voltage drop through the signal line leading to the test site. Because this signal line typically includes solder connections and pogo pin contacts, its resistance is impossible or impractical to predict using current technology. Therefore, the distance from the test site to the point at which the signal path splits into force and sense path is a determinant of test quality, referred to in the low-current test industry as the degree to which the test configuration approaches the ideal "true kelvin" configuration in which the force and sense paths are connected by the conductive test site itself.

Collectively, the force and sense paths are referred to as the signal path(s). On pogo probe cards the force and sense paths are typically in the form of conductive traces, both of which are on the top surface of the card.

Designers of ultra-low current probe cards have been concerned with reducing probe card leakage currents. These are unwanted currents that can flow into a first force or sense path from nearby conductive path sets, thereby distorting the current measured in the first force or sense path. The amount of leakage current between two conductive path sets is dependant on the resistivity of the insulating material that separates the paths. When measuring in the femtoamp order of magnitude, even materials which are generally thought of as being completely insulative, such as rubber or glass-epoxy, may permit a detrimental flow of leakage current.

To protect a test station from electromagnetic interference, elaborate shielding has been developed. U.S. Pat. No. 5,345,170, which is assigned to the same assignee as the present application, describes one such design.

One technique that has been used for suppressing inter-channel leakage currents on pogo probe cards is providing "guard" traces on both sides of a force or sense trace on the top surface of the card which is maintained at the same potential as the signal trace on the top surface of the card by a feedback circuit in the output channel of the test instrument. Because the voltage potentials of the outer guard traces on both sides of a force or sense trace on the top surface of the card and the inner signal trace are made to substantially track each other, negligible leakage current will flow across the dielectric material of the card that separates these traces.

Although leakage current can still flow between neighboring guard traces, this is typically not a problem because these guard conductors, unlike the inner signal trace, are at low impedance. By using this guarding technique, significant improvement may be realized in the low-level current measuring capability of pogo probe cards.

Low current pogo probe cards that have force, sense, and guard traces have a "pad set" for each signal channel consisting of a force, sense, and guard pad and a corresponding "trace set" consisting of a guard trace and a combined force and sense trace.

To further improve low-current measurement capability, pogo probe cards have been constructed so as to minimize leakage currents between the individual probing devices that mount the probing needles or other needles. In these devices, higher-resistance ceramic insulating materials have been substituted for lower-resistance materials and additional guard channel conductive surfaces have been added.

In one type of assembly, for example, each probing device is constructed using a thin "blade" of ceramic material, which is a material known to have a relatively high volume resistivity. An elongate conductive trace is provided on one side of the "blade" to form the signal line and a backplane conductive surface is provided on the other side of the "blade" for guarding purposes.

The probing element of this device is formed by a slender conductive needle, such as of tungsten, which extends in a cantilevered manner away from the signal trace. Such devices are commercially available, for example, from Cerprobe Corporation based in Tempe, Ariz. During assembly of the probe card, the ceramic blades are edge-mounted in radial arrangement about the opening in the card so that the needles terminate below the opening in a pattern suitable for probing the test device.

The conductive backplane on each blade is connected to the guard trace of the corresponding pogo pin set and also to a corresponding conductive pad or "land" adjacent the central opening in the probe card. In this manner each conductive signal line is guarded by the conductive backplane on the opposite side of the blade and by the conductive land beneath it.

It has been found, however, that even with the use of guard traces and ceramic probing devices, the level of undesired leakage current is still not reduced sufficiently to match the femtoamp range measurement capabilities of the latest generation of commercially available test instruments. Thus, it has become evident that other changes in pogo probe card design are needed in order to keep pace with the technology of test instrument design.

In an additional design for a pogo probe card, each guard trace is connected by a series of plated vias through the probe card to an auxiliary guard trace that is formed on the bottom exterior surface of the card. The auxiliary guard traces parallel respective signal traces toward the center of the card.

This design leaves a number of problems still unresolved. First, leakage current may flow between the plated vias through the dielectric material that separates each guard trace from the corresponding auxiliary guard trace.

Second, the capacitance between traces of neighboring trace sets permits cross-talk. This means that a change in electric potential in a first trace set will cause a temporary change in potential in the trace of neighboring trace sets, potentially corrupting a test result.

Third, the dielectric absorption of the probe card material adjacent or interposed between neighboring trace sets results in a delay in charging and discharging the trace sets to a predetermined potential. In essence, the dielectric absorption forms a capacitor that must be charged or discharged to reach a different voltage. A test sequence for a particular IC wafer may include hundreds of brief tests. A delay of 1 second or a fraction thereof in the performance of each test, may substantially increase the total test time. By reducing the settling time of the trace sets, it may be possible to run the same number of test sequences in less time and with fewer test stations.

An additional problem encountered in prior art probe cards is the problem of probing needle damage. Probing needles occasionally break, or are otherwise damaged during testing, requiring replacement or repair. In currently available probe cards, when a probing needle breaks, the entire probing device must be replaced which is time consuming and expensive.

What is desired, therefore, is a pogo probe card with increased isolation between traces resulting in reduced leakage currents, reduced cross-talk between trace sets, and reduced settling time for each trace set.

SUMMARY OF THE INVENTION

The present invention overcomes the aforementioned drawbacks of the prior art by providing in a first aspect a pogo probe card that has auxiliary guard traces interposed between top and bottom dielectric layer of the card. Preferably, a set of conductors formed through the top dielectric layer electrically interconnects each guard trace on the top surface of the card to the auxiliary guard trace. By interposing the auxiliary guard traces between the top and bottom dielectric layers it is possible to place the auxiliary guard traces in close proximity to the guard trace on the top surface of the card, thereby reducing leakage current by reducing the cross-section for the leakage current path, but nevertheless providing a card with sufficient structural integrity.

In another aspect of the present invention, the pogo pin receptive pad sets of the pogo probe card are connected to the probe devices by coaxial or triconductor ("triax") cables, rather than by traces on the card. This permits far greater isolation and complete guarding of each signal channel.

In a further aspect of the present invention, the probe card includes probing device holders that permit probing devices to be easily replaced when broken or damaged.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 1 is a top sectional view of a prior art low-current pogo probe card.

FIG. 2A is an isometric sectional view of a low-current pogo probe card according to the present invention.

FIG. 2B is a cross-sectional view of the low-current probe cards of FIGS. 2A and 6A taken along line 2B—2B of FIG. 6A.

FIG. 3 is a sectional top view of the pogo probe card of FIG. 2.

FIG. 4 is a sectional isometric view of the pogo probe card of FIG. 2.

FIG. 5 is a transverse cross-sectional view of the low noise coaxial cable shown in FIGS. 2, 3, 4, 6A, 6B, 6D and 6F.

FIG. 6A is top sectional view of the low-current pogo probe card of FIG. 2 showing a first method of connecting the pogo pin receptive pad sets to the probing devices.

FIG. 6C is top sectional view of the low-current pogo probe card of FIG. 2 showing a third method of connecting the pogo pin receptive pad sets to the probing devices.

FIG. 7A is a cross-sectional view of the low noise triconductive coaxial cable shown in FIG. 6C.

FIG. 7B is a cross-sectional view of a low noise triconductive cable that may be substituted for the cable of FIG. 7A.

FIG. 10A is a top sectional view of an additional alternative embodiment of a low-current pogo probe card according to the present invention.

FIG. 10B is a cross-sectional view of the low-current pogo probe card of FIG. 10A taken along line 10B—10B of FIG. 10A.

FIG. 11 is a pictorial view of an exemplary embodiment of a probe housing with a probe connector, and probing device for use in the present invention.

FIG. 12 is a cross-sectional view of the probe housing and probing device engaged within the probe connector of FIG. 11.

FIG. 13 is a cross-sectional view of the probe connector and probing device of FIG. 11.

DETAILED DESCRIPTION OF THE PREFERRED EMBODIMENTS

Figure 6B:
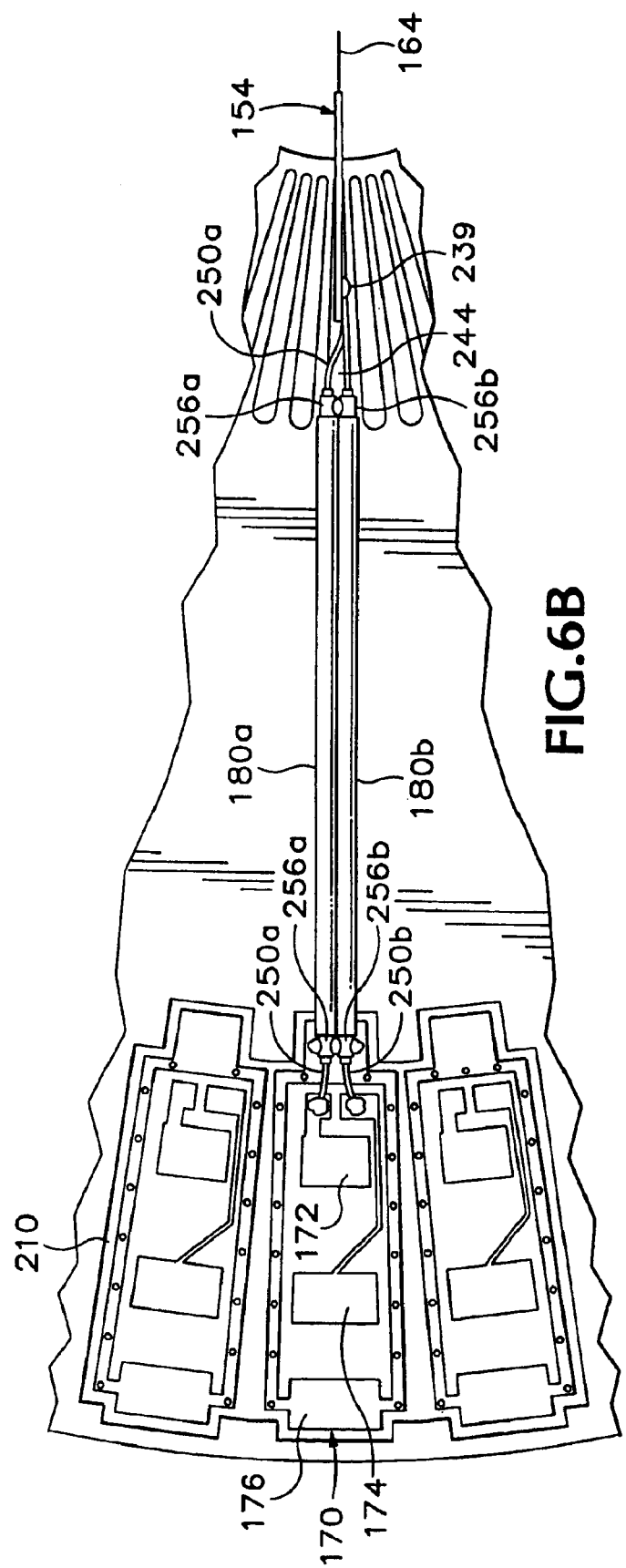
FIG. 6B is top sectional view of the low-current pogo probe card of FIG. 2 showing a second method of connecting the pogo pin receptive pad sets to the probing devices.

FIG. 1 shows a section of a prior art low-current pogo probe card 110. Pogo pin receptive pad set 112 is comprised of a conductive sense line pad 114, a conductive force line pad 116 and a conductive guard line pad/trace 118 formed on a dielectric board 113. Each sense line pad 114 and force line pad 116 join together to form a signal trace 119, which connects with a probing device 120. An auxiliary guard trace (not shown) on the bottom surface of card 110, is electrically connected to each guard trace 118 through a series of plated vias 121. Each guard trace 118 is electrically connected into a conductive land 122 which is electrically connected to a guard plane side of probing device 120 by solder point 124. Each signal trace 119 is electrically connected, via wire 127, to an electrical connection point 126 on a respective probing device 120, which in turn is connected to a respective probing needle 128. Unfortunately, when used for making ultra-low current measurements card 110 hampers the testing effort because of excessive charge-up time, cross talk, poor shielding of the test subject workpiece and incomplete signal guarding.

Referring to FIGS. 2–6A a low-current pogo probe card 152 is constructed in accordance with the present invention. This card includes a plurality of probing devices 154 (only one shown in FIG. 2), arranged in a circular arrangement, supported on the top of an inner rim 156 of an annular laminate board 158.

Each probing device 154 includes a probing needle 164. Probing needles 164 are typically composed of tungsten and extend generally radially inwardly in a cantilevered manner into a circular opening 166, which is defined by inner rim 156. Each probing needle 164 and probing device 154 are carefully adjusted by a technician so that the point of the probing needle 164 will contact one out of a set of test contact sites on a predetermined test subject workpiece (not shown), which is to be placed beneath card 152 for testing.

Near the outer rim of annular laminate board 158 are a plurality of pogo pin receptive pad sets 170, each of which includes a conductive force line pad 172, a conductive sense line pad 174 and a conductive guard line pad/trace 176 that surrounds both sense line pad 174 and force line pad 172.

A set of coaxial cables 180 (only one shown in FIG. 2) connect each pad set 170 to a respective probing device 154 as described herein. An annular electromagnetic shield 182, protects the signals being carried by cables 180 from electromagnetic interference. The shield 182 may be connected to the shield of the test probe station.

FIG. 2B is a cross-sectional view taken along line 2B—2B of FIG. 6A. Laminate board 158 comprises a top or first dielectric layer 200, a bottom or second dielectric layer 202 (in this instance layer 202 is composed of two laminae), and an auxiliary guard trace 204 interposed between layer 200 and layer 202. A set of plated vias 206 electrically connect guard line pad/trace 176 to auxiliary guard trace 204, which is maintained at the guard voltage. In this embodiment plated vias 206 perforate laminate board 158, although this is only necessary for vias 206 to breach top layer 200 in order to connect with corresponding auxiliary guard trace 204. Alternatively, wire wraps could extend around the exterior periphery to interconnect guard line pad/trace 176 to guard trace 204. The shorter distance between pad set 170 and auxiliary guard trace 204, made possible by the interposition of auxiliary trace 204 within laminate board 158, results in a greater isolation of pad sets 170 from each other and from outside electromagnetic noise. This primarily reduces the dielectric absorption and thus settling time for signals.

A trench 210 separates pad sets 170 from one another. Trench 210 reduces the capacitance between pad sets 170, thereby reducing cross-talk between pad sets 170 and further reducing the settling time for each individual pad set 170. The reduction in capacitance is primarily due to the much smaller dielectric constant of air compared with any of the available solid dielectric materials, such as polyimide, which has a dielectric constant approximately eight times that of air. Trench 210, which is not plated preferably extends through and therefore separates auxiliary guard traces 204 from one another. Typically in manufacture a solid conductive plate is interposed between dielectric layers 200 and 202. This layer is then divided into auxiliary traces 204 when trenches 210 are machined therein. Alternatively, even without the trench 210, the reduced cross section between the pad sets 170 and the auxiliary guard traces 204 reduces leakage currents. In this variant, the auxiliary guard traces 204 would be formed as separated metalized areas under each pad set 170.

Referring to FIGS. 3 and 4, each cable 180 is electrically connected to a proximal end of a probing device 154. Each probing device 154 includes a dielectric substrate or "blade" 236 preferably formed of ceramic or a comparable high-resistance insulating material.

Each blade 236 has a first and a second major surface, which are parallel to each other. On the first surface of each blade is an elongate conductive path 238 that connects probing needle 164 to an electrical connection point 239. The second major surface bears a conductive plate 240. Blade 236 is generally L-shaped in profile and is edge-mounted on the top of inner rim 156 of annular laminate board 158 so that its short arm extends through opening 166 thereby permitting needles 164 to terminate below opening 166. Blades 236 having a construction of the type just described are commercially available from Cerprobe Corporation of Tempe, Ariz.

A plurality of conductive lands 244 are formed on the laminate board 158 about the opening 166 in circumferentially spaced relationship to each other. A solder connection 248 electrically connects conductive plate 240 to a conductive land 244.

FIG. 5 shows a cross-sectional view of a preferred coaxial cable 180, which includes an inner conductive core 250, an inner dielectric 252, a buffer layer 254, an outer conductor 256 and an insulative jacket 258. Buffer layer 254 is of suitable composition for reducing triboelectric current generation between inner dielectric 252 and outer conductor 256 to less than that which would occur were inner dielectric 252 and outer conductor 256 to directly adjoin each other. Buffer layer 254 should have physical properties similar to inner dielectric 252 so that layer 254 does not rub excessively against inner dielectric 252 despite cable flexing or temperature changes.

Moreover, buffer layer 254 should have sufficient conductive properties to dissipate any charge imbalances that may arise due to free electrons rubbing off the outer conductor. A suitable material for this purpose is a fluoropolymer such as TEFLON™ or other insulative material such as polyvinylchloride or polyethylene in combination with graphite or other sufficiently conductive additive.

In the field of radio frequency (rf) cable technology, cables that include a layer of the type just described are generally referred to as "low-noise" cables. Commercial sources for this type of cable include Belden Wire and Cable Company based in Richmond, Ind. and Suhner HF-Kabel based in Herisau, Switzerland. With regard to the preferred embodiment depicted, the cable which was used was purchased from Times Microwave Systems based in Wallingford, Conn.

It should be noted that some care must be exercised while connecting cable 180 to probing device 154 in order to prevent defects that would substantially degrade the low-current measuring capability probe card 152. Referring to FIGS. 3–4, a solder connection 260 connects the inner conductor 250 of each cable 180 to conductive path 238 at electrical connection point 239 of a corresponding probing device 154.

Before making this connection, it is desirable to position cable 180 so that the conductive and dielectric layers in cable 180 that surround inner core 250 are set back a certain distance 262 away from the proximal edge of the probing device 154. This reduces the possibility that a fine strand of hair or other contaminant will form a low-resistance or conductive bridge so as to cause a low-resistance shunt or short across the signal line. Also, in making this connection, it is important not to overheat the cable so as not to impair the structural properties of inner dielectric 252, which material may comprise, for example, air-expanded TEFLON™ for maximum temperature stability.

Finally, after the connection has been made, all solder flux residue that remains should be removed from the board in order to prevent undesired electrochemical effects and to maintain the surface resistivity of the laminate board 158 at a reasonable level.

In order to further reduce the possibility of undesirable shunting connections, outer conductor 256 (typically a metallic braid) of cable 180 is connected indirectly to conductive surface 240 through conductive land 244.

Moreover, with respect to probing devices 154, each elongate conductive path 238 is guarded by conductive path plate 240 on the opposite side of the blade 236 and by the corresponding conductive land 244 which is arranged below the path. Solder connection 264 electrically connects the outer conductor 256 to conductive land 244 and a second solder connection 248 electrically connects conductive land 244 to the backplane conductive surface 240. Again, care must be taken not to overheat cable 180 or to leave solder flux residue on laminate board 158.

During use of probe card 152, the signal variation or voltage is transmitted to the test site by means of inner conductor 250, elongate conductive path 238 and probing needle 164. Preferably, the test equipment is connected so that a feedback circuit in the output channel of the test equipment supplies a "guard" voltage that matches the instantaneous signal voltage, which guard voltage is applied to outer conductor 256 and to conductive land 244. By use of the cable 180, additional shielding is achieved by nearly eliminating the capacitance associated with the prior art use or long traces on the probe card to route the signal from the pad sets 170 to the probing devices 154. Accordingly, the cable 180 reduces the leakage currents and settling time.

Moreover, with respect to probing devices 154, each elongate conductive path 238 is guarded by conductive plate 240 on the opposite side of the blade 236 and by the corresponding conductive land 184 which is arranged below the path. By minimizing leakage currents into and out of each elongate path 238, this guarding system reduces the levels of undesired background current and so enhances the effect achieved by the use of cables in suppressing leakage currents and reducing settling times.

FIGS. 6B–6E show alternative structures for connecting a pad set 170 to a probing device 154. FIG. 6B shows a first coaxial cable 180a and a second coaxial cable 180b connecting a pad set 170 to a probing device 154. A center conductor 250a of cable 180a connects force line pad 172 to point 239 whereas a center conductor 250b of cable 180b connects sense line pad 174 to point 239. An outer conductor 256a of first cable 180a and an outer conductor 256b of second cable 180b both connect guard line pad/trace 176 to land 244. This structure provides separate guarding for the force and sense signals until connection with the elongate conductive path 238 of the probing device 154. This configuration a force and sense connection that more closely approximates an ideal "true kelvin" connection then the configuration of FIG. 6A.

FIGS. 6C and 7A show an alternative design in which a cable with three conductors that share a common axis (a "triax") triax 276 connects a pad set 170 to a corresponding probing device 154. Innermost conductor 250c of cable 276 connects sense pad 174 to elongate path 238, middle conductor 256c connects force pad 172 to electrical connection point 239, and exterior conductor 280 connects guard line pad/trace 176 to conductive land 244. FIG. 7A, which is described later, shows a transverse cross-sectional view of cable 276.

Figure 6D:
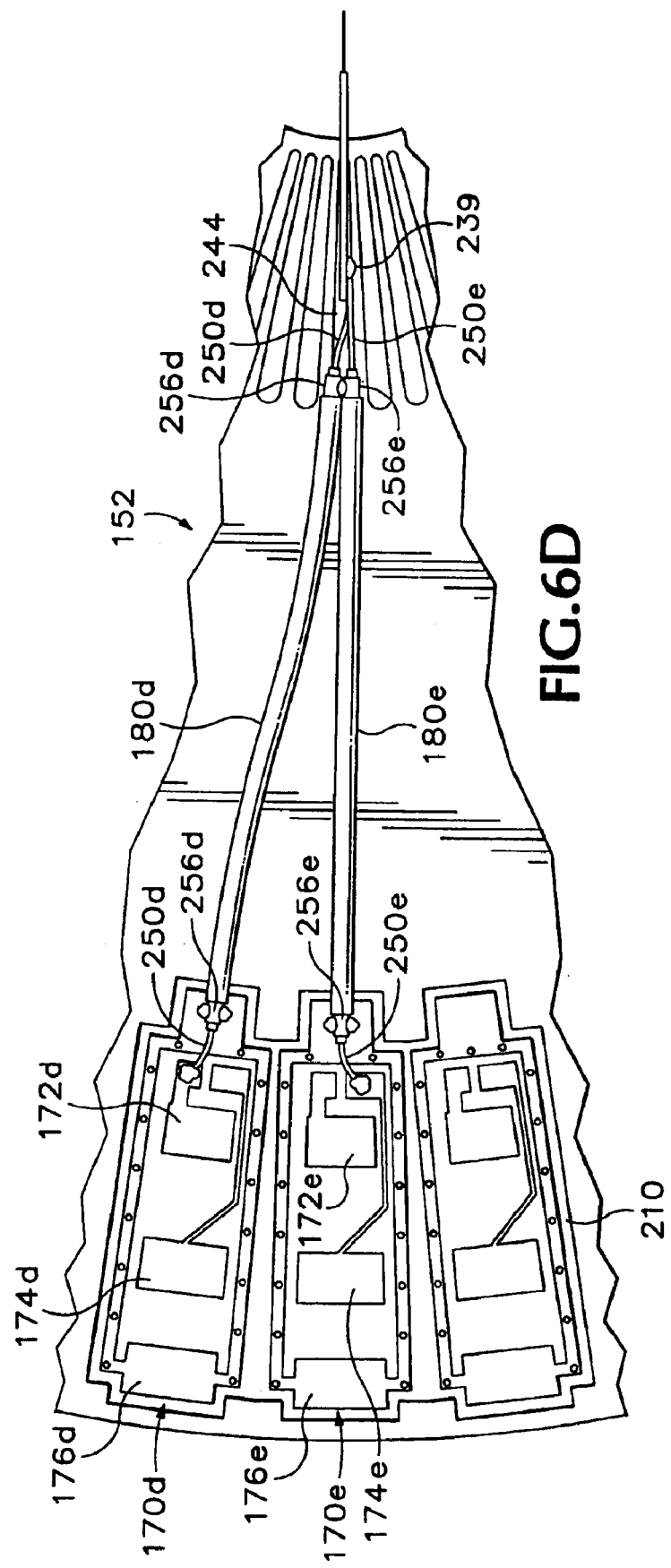
FIG. 6D is top sectional view of the low-current pogo probe card of FIG. 2 showing a forth method of connecting the pogo pin receptive pad sets to the probing devices.

FIG. 6D shows a connection scheme in which a first and a second pad set 170d and 170e are connected to the same probing device 154 by two coaxial cables 180d and 180e. The force line pad 172d of first pad set 170d and the sense line pad 174e of a second pad set 170e are both connected to electrical connection point 239 via a center conductor 250d of first coaxial cable 180d and a center conductor 250e of second coaxial cable 180e respectively. Guard line pad/trace 176d of a first pad set 170d and guard line pad/trace 176e of second pad set 170e are both connected to a land 244 by an outer conductor 256d of first coaxial cable 180d and an outer conductor 256e of second coaxial cable 180e, respectively. This configuration approximates a "true kelvin" connection in the same manner as the configuration shown if FIG. 6B.

Figure 6E:
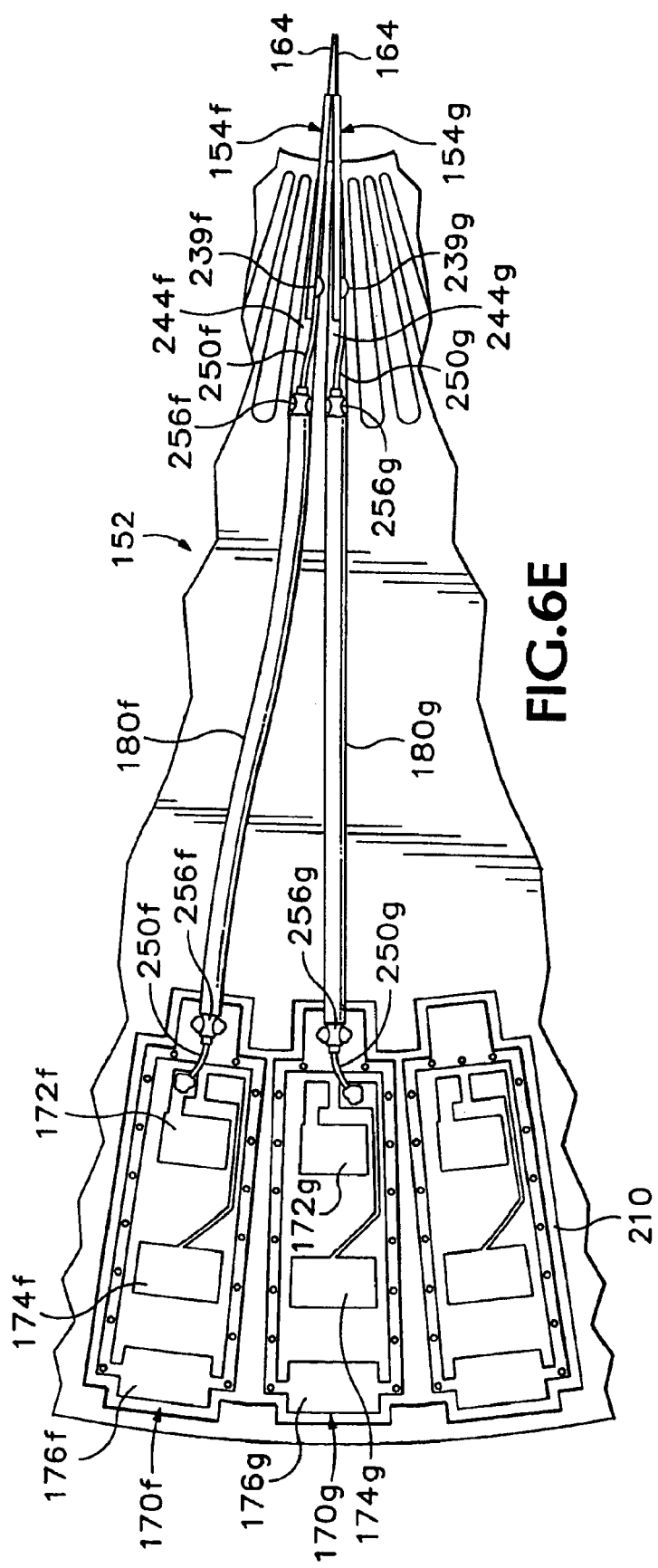
FIG. 6E is top sectional view of the low-current pogo probe card of FIG. 2 showing a fifth method of connecting the pogo pin receptive pad sets to the probing devices.

FIG. 6E shows a connection scheme in which two adjacent pad sets 170f and 170g are connected to two adjacent probing devices 154f and 154g by two coaxial cables 180f and 180g. The probing needles 164 of both probing devices 154f and 154g are directed to the same testing site on the test subject workpiece to create a "true kelvin" connection between force and sense. The force line pad 172f of first pad set 170f is electrically connected to an electrical connection point 174g by way of center connector 250f of cable 180f. The sense line pad 174g of second pad set 170g is electrically connected to an electrical connection point 239g by way of center connector 250g of cable 180g. Guard line pad/traces 176f and 176g of first and second pad sets 170f and 170g are connected to lands 244f and 244g, respectively by outer conductors 256f and 256g, respectively.

FIG. 7A shows a transverse cross-sectional view of cable 276 of FIG. 6C. In similarity to cable 180, cable 276 includes an inner conductor or core 250c, an inner dielectric 252c, an inner layer 254c, an outer conductor 256c and an insulative jacket 258c. Cable 276 further includes a second inner dielectric 278 and a second outer conductor 280. Cable 276 is a low noise triax cable.

FIG. 7B shows a variant triconductive cable 281 which may be used in the configuration of FIG. 6C instead of cable 276. In the approximate center of cable 281 are a force conductor 282 (to be connected in like manner to conductor 256c of FIG. 6) and a sense conductor 284 (to be connected in like manner to 250c of FIG. 6). A low noise dielectric layer 286 surrounds conductors 282 and 284. A conductive guard layer 288, in turn, surrounds layer 286. Finally, a dielectric insulative layer 290 surrounds layer 288.

Figure 8:
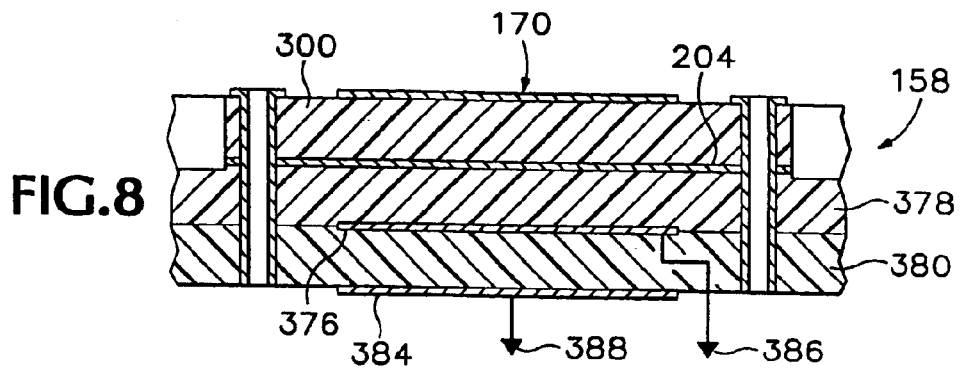
FIG. 8 is a cross-sectional view of an alternative embodiment of a low-current probe card having a top view identical with that of FIGS. 2A and 6A–6E and taken along line 2B—2B of FIG. 6A.

FIG. 8 shows a cross-section taken along line 2B—2B of FIG. 6A of an embodiment of laminate board 158 in which a third layer of conductive material 376 is interposed between a second layer of dielectric material 378 and a third layer of dielectric material 380. Additionally, a fourth layer of conductive material 384 is attached to the bottom of layer 380. Third layer 380 is connected to a first electrical feature 386 and fourth conductive layer 384 is connected to a second electrical feature 388. The first and second electrical features 386 and 388 may be the same.

In one variant, feature 386 is the "chuck" or "return" guard. This chuck or return guard is described in greater detail in U.S. Pat. No. 5,345,170, which is assigned to the assignee of the present application and is incorporated by reference into the present application as if fully set forth herein. In the case where the return signal path is through the wafer and into the chuck, this allows for a return guard path from the chuck guard that is the same as the guard of the probe card.

In a second variant, feature 386 is the same as shield 182, so that layer 376 forms a bottom shield for card 152.

In a third variant feature 386 is an instrument channel set to drive layer 380 to parallel the potential of whichever signal channel was actively engaged in forming a measurement. In this application layer 376 or 384 would be connected to a test instrument channel that would drive layer 376 or 384 to the voltage of whatever trace set was actively engaged in a measurement. This would reduce noise and settling time. The second and third variants perform the important additional function of shielding or guarding, respectively, the test subject workpiece. This task is rendered comparatively more difficult in the pogo probe environment because of the 21 cm (8.5 in) aperture required to accommodate the introduction of the pogo probe head into the shielded box that is used in ultra-low current testing. By placing a guard or shield or both in the bottom portion of the probe card 152, the test subject workpiece may be shielded or guarded or both despite the presence of this aperture.

In another set of three variants, feature 388 would represent either the guard chuck, shield 182, or the test instrument channel set to mimic the active measurement channel. Typically, conductive layer 376 and 384 (either one of which may be omitted) would be continuous over the area of board 158, except they would be cut away to avoid contact with vias 206. In the third variant the additional layer 376 or 384 may be divided into additional auxiliary guard traces.

Dielectric layers 200, 378, and 380 are all about 1 mm (39 mils) thick. Dielectric layer 202 (FIG. 2B) is about twice that thickness to provide sufficient structural strength to board 152. Pad sets 170 and conductive layers 204, 376 and 384 are typically about 75 microns (3 mils) thick. Dielectric layers 200, 202 (FIG. 2B), 378 and 380 are typically composed of polyimide or FR4. Pad sets 170, plated vias 206 and conductive layer 384 are typically made of gold over copper or some other highly conductive material. Conductive layers 204 and 376 are typically made of copper.

Figure 9A:
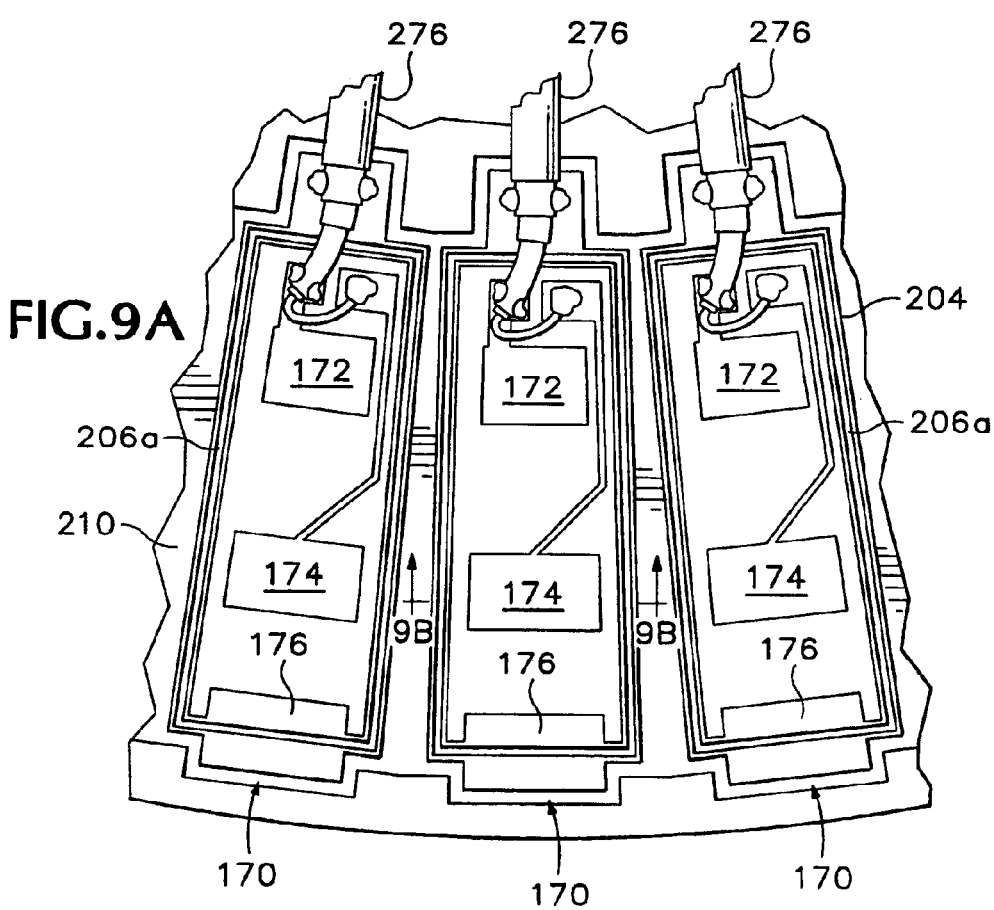
FIG. 9A is a top sectional view of a further alternative of a low current pogo probe card.
Figure 9B:
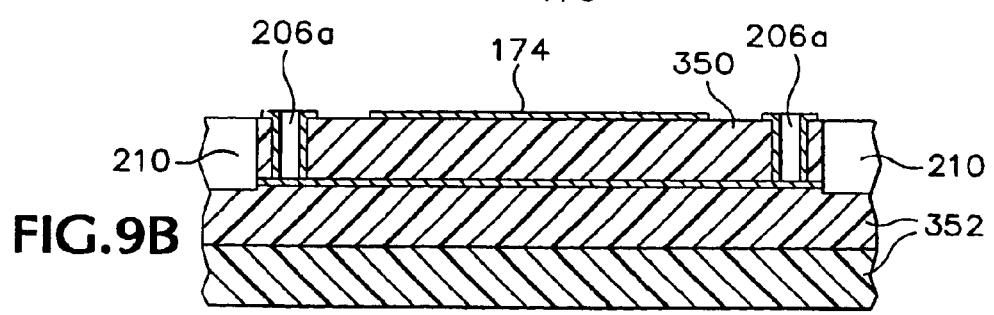
FIG. 9B is a cross-sectional view of the low current pogo probe card of FIG. 9A taken along line 9B—9B of FIG. 9A.

FIGS. 9A and 9B show an embodiment in which a set of continuous plated trenches 206a replaces vias 206 of FIG. 2A. Continuous trenches 206a more thoroughly isolate pad sets 170 than do vias 206.

Yet another embodiment is shown in FIGS. 10A and 10B. In this embodiment, a pogo probe card 410, in similarity to probe card 152, includes probing device 154. In contrast, however, conductive traces replace the cables of the previous embodiments. This embodiment includes a pogo pin receptive pad set 420 having a force line pad 422, a sense line pad 424 and a guard line pad 426. Force line pad and sense line pad merge into signal trace 428. Guard line pad 426 is electrically connected with guard line trace 430 which protects the force and sense line signals from electromagnetic interference and is electrically connected through a series of plated vias 432 to auxiliary guard line trace 434. Each signal trace is connected to an electrical connection point 239 of corresponding probing device 154 by a wire 438.

Each pair of auxiliary guard traces 434 is separated by a set of trenches 436. Similar to trenches 210 trenches 436 separate auxiliary traces 434 and reduces cross capacitance between pad sets 420 and traces 428 and 432 thereby reducing cross-talk and settling time. This embodiment may be somewhat less expensive to produce in large numbers than the previously described embodiments.

FIGS. 11–13 shows a probing device holder 502 holding a probing device or blade 504, that includes a probing needle 505, and further including coaxial cable connectors 506 and 508. Skilled persons will appreciate that a number of holders 502 could be attached to the top of rim 156 of laminate board 158 (FIG. 2). Skilled persons will further appreciate that board 152b of FIG. 6b can be modified so that cables 180a and 180b both terminate in bayonet navy connectors that would screw onto connectors 506 and 508. This arrangement would render the advantage of replaceable probing devices 504. With currently available test boards the breakage or damage of a probing needle during test necessitates a rather difficult and time consuming soldering or repair procedure. By attaching holders 502 to a test board, the replacement procedure is greatly simplified. In like manner any of the embodiments of FIGS. 6A–6E, could be fitted with replaceable probing devices 504. Skilled persons will note that a triax connector could be fitted to holder 502 to accommodate the triax cable 276 of FIG. 6.

Skilled persons will further readily recognize that the connection structure of connectors 506 and 508 could be cut away and that the center connectors of 250a and 250b of cables 180a and 180b (FIG. 6B) could be soldered to connection point 576 (FIG. 13) with outer conductors 256a and 256b being connected to the exterior of holder 502.

With respect to the detailed structure of holder 502, an elongate probe connector 552 is conductive and preferably has a rectangular cross section. An insert 554 is sized to fit within the probe connector 552. Insert 554 includes a ceramic insulator 556 and a conductive bent connector 558 attached to one side of the insulator 556. Insulator 556 is in face-to-face abutment with the interior upright surface 559 of probe connector 552. Probing device 504 is matingly and detachably engageable within the probe connector 552.

Referring also to FIG. 13, device 504 preferably includes a dielectric substrate 562 formed of a ceramic or a comparable high-resistance insulating material. Device 504 has a pair of broad parallel sides or faces interconnected by a thin edge. Formed on one side of the device 504 is an elongate conductive path 564, while the other side includes a backplane conductive surface 566. A needle 568 is supported by dielectric substrate 562 and electrically connected to elongate conductive path 564.

In the particular embodiment shown, the blade 504 is generally L-shaped in profile and is edge-mounted within the probe connector 552 so that the short arm of the L-shaped blade 504 extends downwardly making contact with the test subject device.

Referring also to FIG. 13, when the blade 504 is slidably engaged within the probe connector 552, the backplane conductive surface 566 is in face-to-face contact with the inner upright surface 559 (FIG. 11) of the probe connector 552. Accordingly, a guard signal path is provided from the guard conductors of the force and sense cables 514 and 516, though the probe housing 550 and probe connector 552 to the backplane conductive area 566 of the blade 560. This provides a guard path to a location near the end of the needle 568. In addition, a conductive path is provided from force and sense conductors 572 and 574 through a combined conductor 570 to the bent connector 558. It is to be understood that the combined connector 570 may be any suitable type of coupler that electrically connects the force and sense cables to the conductive path 564 on the blade 560. Likewise it is to be understood that the electrical connection between the backplane 566 on the blade 504 and the connectors 504 and 506 may be any suitable type of coupler. The bent connector 558 is resiliently deformable as the blade 504 is inserted into the probe connector 552 and exerts pressure between the backplane conductive surface 566 and the upright surface 559 (FIG. 11) so a low loss connection is maintained. Also the pressure maintains the position of the blade 504 during use. Simultaneously, the bent connector 558 exerts pressure between the conductive path 564 and the bent connector 558 to provide a low loss connection. A signal path is thus provided through the needle 568, the conductive path 564, the bent connector 558, and the combined conductor 570 to the force conductor 572 and sense conductor 574. A threaded hole 580 accommodates set screw 582 for rigidly retaining probing device 504, thereby allowing the positional adjustment of probing needle 505.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A probe card comprising:

(a) a board including dielectric layer, said board defining an opening;

(b) probe supported by said board, said probe including a probing element that extends through said opening;

(c) a conductive pad supported by said board;

(d) a conductive path electrically interconnecting said probing element and said pad; and (e) at least one of (1) a planar conductive member interposed within said board at a location at least partially directly underneath at least one of said conductive pad and said conductive path and (2) a conductive member positioned within said board and coextensive with a major portion of said board.

2. The probe card of claim 1 wherein said conductive path is a trace supported by the upper surface of said board.

3. The probe card of claim 1 wherein said conductive member is a trace interposed within said board.

4. The probe card of claim 1 wherein said conductive path includes a conductor of a cable.

5. The probe card of claim 1 wherein said conductive pad is a first conductive pad, said first conductive pad is part of a pad set that further includes a second conductive pad substantially electrically isolated from said first conductive pad.

6. The probe card of claim 5 wherein said conductive member is electrically connected to said second conductive pad.

7. The probe card of claim 5 wherein at least one of said first conductive pad and said second conductive pad is electrically connected to a surface conductive trace supported by said upper surface, said surface conductive trace encircling said pad set.

8. The probe of claim 7 wherein said surface conductive trace is electrically connected to said conductive member by a plurality of vias.

9. The probe of claim 7 wherein said surface conductive trace is electrically connected to said conductive member by at least one plated trench.

10. The probe card of claim 1, wherein said conductive pad is a first conductive pad, further including a second conductive pad that is spaced apart from said first conductive pad, a trench breaching said upper surface between said first conductive pad and said conductive second pad.

11. The probe card of claim 1 further including an additional conductive member interposed within said probe card.

12. The probe card of claim 1 further including additional conductive pads and being adapted to mate to a pogo head.

13. The probe card of claim 1 wherein said conductive member is said at least partially directly underneath said conductive pad.

14. The probe card of claim 1 wherein said conductive member is said at least partially directly underneath said conductive path.

* * * * *